United States Patent [19]

Denton et al.

[11] Patent Number: 4,808,291

[45] Date of Patent: Feb. 28, 1989

[54] APPARATUS FOR COATING COMPACT DISKS

[75] Inventors: Peter R. Denton; David Boyarsky, both of Cherry Hill, N.J.

[73] Assignee: Denton Vacuum Inc., Cherry Hill, N.J.

[21] Appl. No.: 94,684

[22] Filed: Sep. 9, 1987

[51] Int. Cl.$^4$ .............................................. C23C 14/56
[52] U.S. Cl. .................... 204/298; 118/719; 118/729; 414/222; 414/223
[58] Field of Search ............... 204/298; 118/719, 729; 414/222, 223

[56] References Cited

U.S. PATENT DOCUMENTS

| | | | |
|---|---|---|---|
| 4,500,407 | 2/1985 | Boys et al. | 204/298 |
| 4,701,251 | 10/1987 | Beardow | 204/298 |
| 4,733,631 | 3/1988 | Boyarsky | 118/719 |

*Primary Examiner*—Aaron Weisstuch
*Attorney, Agent, or Firm*—William E. Cleaver

[57] ABSTRACT

The present apparatus includes a rotating table which is loaded with removable carriers, each of which holds a substrate to be coated. The carriers are advanced to a loading position and are pushed from the table thereat into a hollow cylinder. Each carrier has a pair of O-rings on its periphery which are squeezed against the inside surface of the cylinder to effect a double seal. Each carrier pushes the carrier ahead of it up through the cylinder in a train like fashion. Along the cylinder there are vacuum stations which act to pump down and degas the substrates. Apertures are provided in the vacuum stations and these apertures are formed to permit the O-rings to expand as the carriers pass by the apertures without causing the O-rings to be cut or scored. Within a vacuum chamber there is included a vapor trap which helps remove water vapor from the substrates during the degassing operation.

5 Claims, 5 Drawing Sheets

APPARATUS FOR COATING COMPACT DISKS

BACKGROUND OF THE INVENTION

The concept of continuously coating substrates has long been a desirable mode of operation and there are machines which can continuously sputter a coating of material (such as aluminum) onto a substrate. The present invention is described in connection with coating aluminum onto compact disk substrates. With respect to coating compact disk substrates, heretofore in the prior art, it has been done by batch systems as well as by continuous systems which are best exemplified by a system developed by a European company. In the prior art system the continuous machine is approximately twenty-two feet long. That prior art system is composed of one long single chamber which has many pumping stages to achieve the required low pressure as the substrates move therethrough. Ideally, the European system is housed in a "clean room" so that the chamber does not become contaminated which in turn would contaminate the substrates and provide inferior coatings. Substrates passing through the European prior art system are held in rectangular blocks and are arranged in a horizontal train as they pass through the single chamber. The sealing endeavor is extremely difficult because a large volume of air is entrapped around each rectangular carrier, which results in high leakage and accordingly many pumping stations are required. The seals which surround the blocks wear out rapidly because of the long horizontal excursion and require relatively frequent replacement. The European system has some undesirable aspects in that it is costly because of its size and its complexity. In addition, it is costly because of the necessity of a large clean room. The prior art operation is a critical operation because of the many vacuum pumping stations in a single chamber. In a preferred embodiment, the present apparatus is approximately seven feet long. The present apparatus is flexible (can be wheeled anywhere) and the present system does not require a clean room. The features of the present system are an improvement on the system described in U.S. Pat. No. 4,733,631.

SUMMARY OF THE INVENTION

The present apparatus (in a preferred embodiment) has a circular rotatable table with apertures located therein toward the tables outer rim. The apparatus is ideally located in close proximity to the output station of a molding press so that a compact disk substrate coming from a molding press is directly loaded into one of the apertures in the rotatable table. If the press fabricates a compact disk substrate every certain number of seconds, for instance, every nine seconds, then the movement of the loading table is synchronized to have an empty aperture available to the molding press every nine seconds. In this way one substrate is coated and leaves the coating machine every nine seconds. In a preferred embodiment a hood is located, or disposed, over the area between the molding press output station and the aperture location on the loading table which receives such substrate. A "clean air" blower is located adjacent to, or within, the hood and that blower blows "clean air" across the area including the press output section and the loading table. In this way, the clean substrates from the press are kept clean without the expense and inflexibility which are dictated by the necessity of a large and completely enclosing "clean room".

Each substrate is held by a carrier. In a preferred embodiment, the carrier is circular in shape and in accordance with the present improvements has a pair of O-rings located around the periphery thereof. The carriers holding the substrates are pushed from the apertures in the loading table into a vertical hollow cylinder. The O-rings are squeezed as they pass through the hollow cylinder and thus they form a double seal to prevent gasses from passing between the wall of the hollow cylinder and the O-rings. Because there are two O-rings associated with each carrier, carriers cannot become skewed which in turn keeps the inside walls of the cylinder from becoming scored. As each carrier enters the hollow cylinder, it pushes the one above and therefore a train of carriers is advanced through the hollow cylinder. In a preferred embodiment, the hollow cylinder has apertures therein at two sections and at those two sections there are vacuum chambers mounted to surround those apertures. In accordance with the present improvement included in the present description, the two sections are counter bored and the apertures are tapered at the edges so that as the O-rings pass the apertures they can expand but do not come into contact with the edges of the apertures which would cause the O-rings to be cut and therefore be in need of replacement. In addition, the walls at the upper end of the vacuum chamber are tapered inward so that the O-rings are gently squeezed into position when they leave the section of the hollow cylinder that has the apertures therein. These two vacuum chambers pump the cylinder sections down and create vacuum conditions in those sections thereby causing substrates passing through those sections to be degassed. One of the most difficult aspects of removing contaminants from the substrates in a pumping section is to get rid of the water vapor. Included in the improvements set out in this description is the addition of a vapor trap in the second vacuum chamber. The water vapor trap serves to condense the water out of the gasses that are pumped from the substrates and enables that water to be successfully removed. The degassed substrates are advanced in a step-like motion and each eventually exits from the vertical hollow cylinder into a coating chamber. The coating chamber is a vacuum stage but it is not held at the low vacuum condition that the last vacuum stage along this hollow cylinder is held. Accordingly, the gas in the coating chamber attempts to escape into the vertical hollow cylinder but the seals effected by the O-rings prevent the gas from escaping. The entry of air and contaminants into the coating chamber is minimized because of the sealing effect of the O-rings and further because the gas pressure "push" in the opposite direction (i.e., from the coating chamber toward the last vacuum stage along the hollow cylinder).

In the coating chamber each carrier is lifted from the exit position of the hollow cylinder and moved toward the coating station. In an alternative embodiment, each substrate can be first cleaned at a cleaning station before it gets to the coating station. Each substrate is advanced in a step-like fashion and remains in a coating position in the coating station for a specific time since the step movement is synchronized to permit the same. The sputtering gun in the coating chamber is repeatedly turned on and turned off to provide sputtering material when the carrier has come to rest and to stop providing sputtering material when the carrier is on the move.

After the substrate has been coated and has been advanced out of the coating position, the coated substrate is eventually pushed down a second hollow cylinder back into the atmosphere and onto the loading table to be lifted therefrom.

The objects and features of the present invention will be better understood when the description below is studied in connection with the drawings wherein:

FIG. 1A is a top view of a substrate carrier while

Figure 1A:
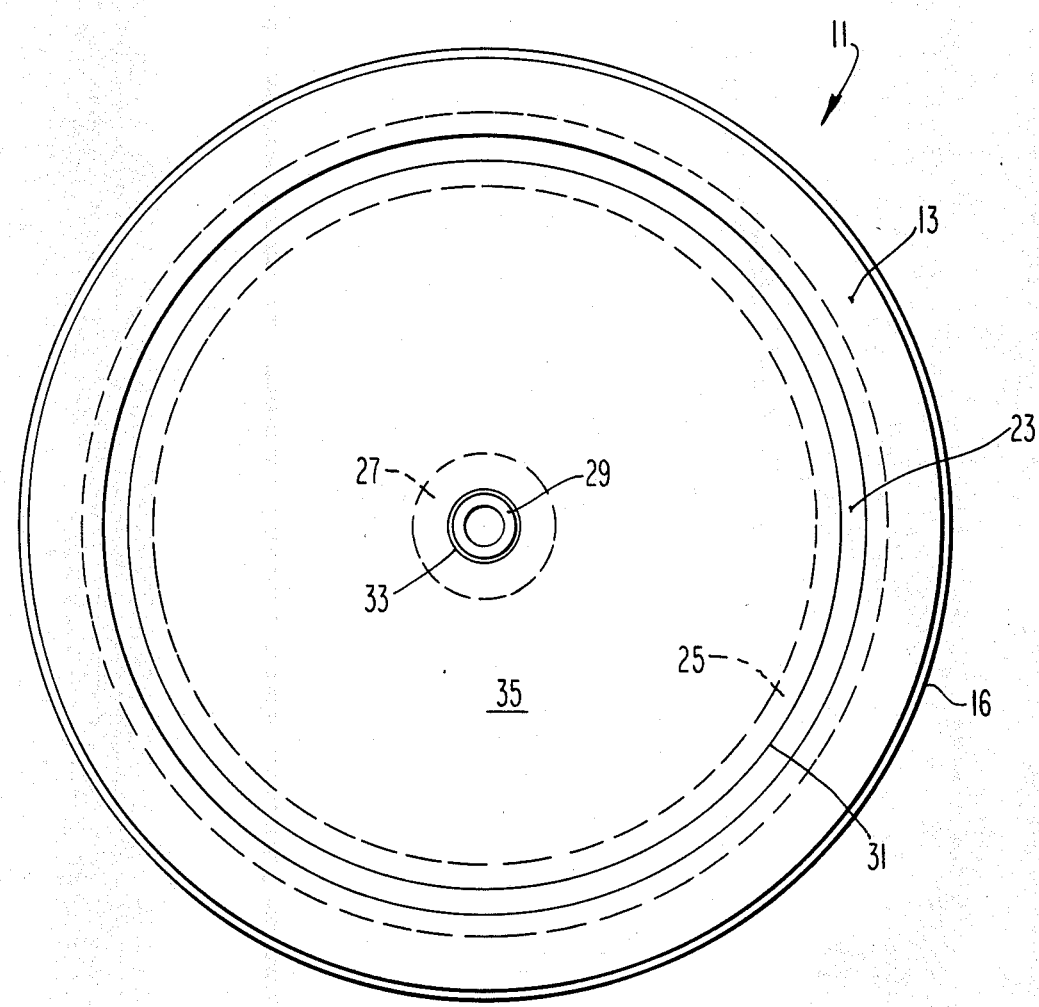
Figure 1B:
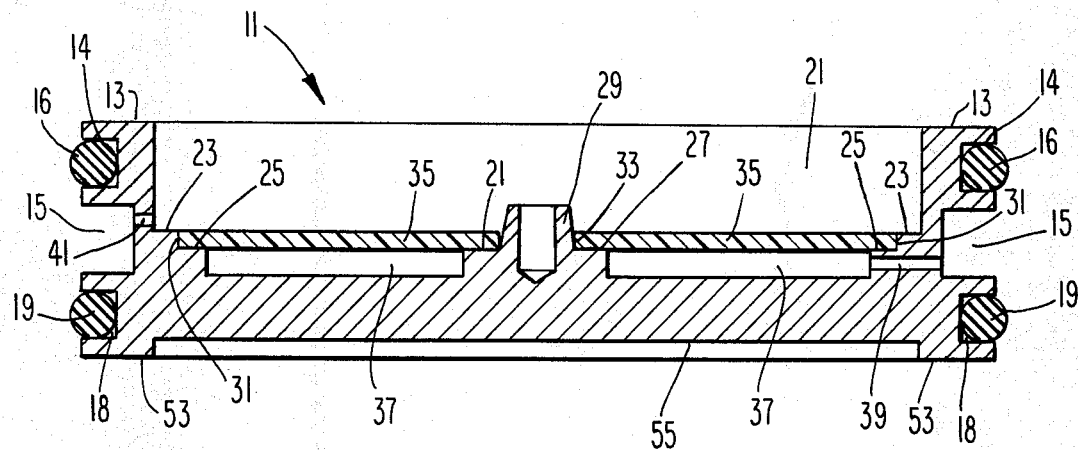
FIG. 1B is an end view of the bottom side of the carrier depicting the pair of O-rings which are present.

Consider FIGS. 1A and 1B. In FIGS. 1A and 1B there is shown a carrier 11. The carrier has an upper outer ledge 13. Beneath the upper ledge 13, as can be gleaned from FIG. 1B, there is formed an 0-ring channel 14 to hold the upper 0-ring 16. Beneath the 0-ring channel structure holding the upper 0-ring 16, there is formed a channel 15. The channel 15 (as will become more meaningful in the discussion of FIG. 3) serves to work with a lifting device to lift the carrier from the hollow cylinder exit onto the rails of a transport apparatus. Further, as can be determined from FIG. 1B, below the channel 15 there is formed an 0-ring channel 18 into which there is located the lower 0-ring 19. The O-rings 16 and 19 act to effect a seal when the carrier 11 is pushed into the vertical hollow cylinder. In U.S. Pat. No. 4,733,631 there was but a single 0-ring and it was determined that a carrier, on occasion, could become skewed and on such occasion the upper part of the carrier would scrape, or score, the inner wall of the vertical hollow cylinder. By having a pair of O-rings 16 and 19, the carrier cannot become skewed and we have found that despite hundreds of excursions along the vertical hollow cylinder none of the carriers have skewed, or scraped, the inner wall. When a carrier is pushed, the O-rings are squeezed and their elastic nature forces them against the wall of the cylinder thereby creating the seals. In the prior art the O-rings were fabricated from Viton material and in particular Viton brown grade A. We have found that if the O-rings are fabricated from polyurethane the O-rings do not wear as quickly and the seal that is provided is more desirable than the seal that was provided by the Viton material.

As can be further seen in FIG. 1B, there is a large aperture 21 formed at the top of the carrier 11. Within the aperture 21 there are formed two ledges 23 and 25. The ledge 25 has an associated ledge 27. The walls 31 and 33 which provide the step configuration between the ledges 23 and 25 and between ledge 27 and the top of the spindle structure 29, respectively, provide a means to hold the compact disk substrate 35 in a horizontal position. In other words, the compact disk substrate 35 is fitted into the upper aperture and more precisely to rest on the ledges 25 and 27 and to be secured within the aperture by the walls 31 and 33. As is shown in FIG. 1B, below the compact disk substrate 35 there is an open space 37. The open space 37 provides a means for readily degassing the compact disk substrate on the lower side. It should be noted that entering the space 37 is a channel 39. It should also be noted that entering the aperture 21 is a shorter channel 41. While in the sectional view of FIG. 1B there is shown only one channel 39 and one channel 41, actually there are many such channels (i.e., there are many channels similar to channel 39 and many channels similar to channel 41). As will be better understood (when we discuss the movement of the carrier through the vertical horizontal cylinder), when the carriers get to the vacuum stages, which lie along the hollow cylinder, the degassing of the substrates is accomplished on the lower side through the space 37 and through the channels 39 while degassing of the substrate is accomplished on the upper side through the aperture 21 and the channels 41.

Figure 2:
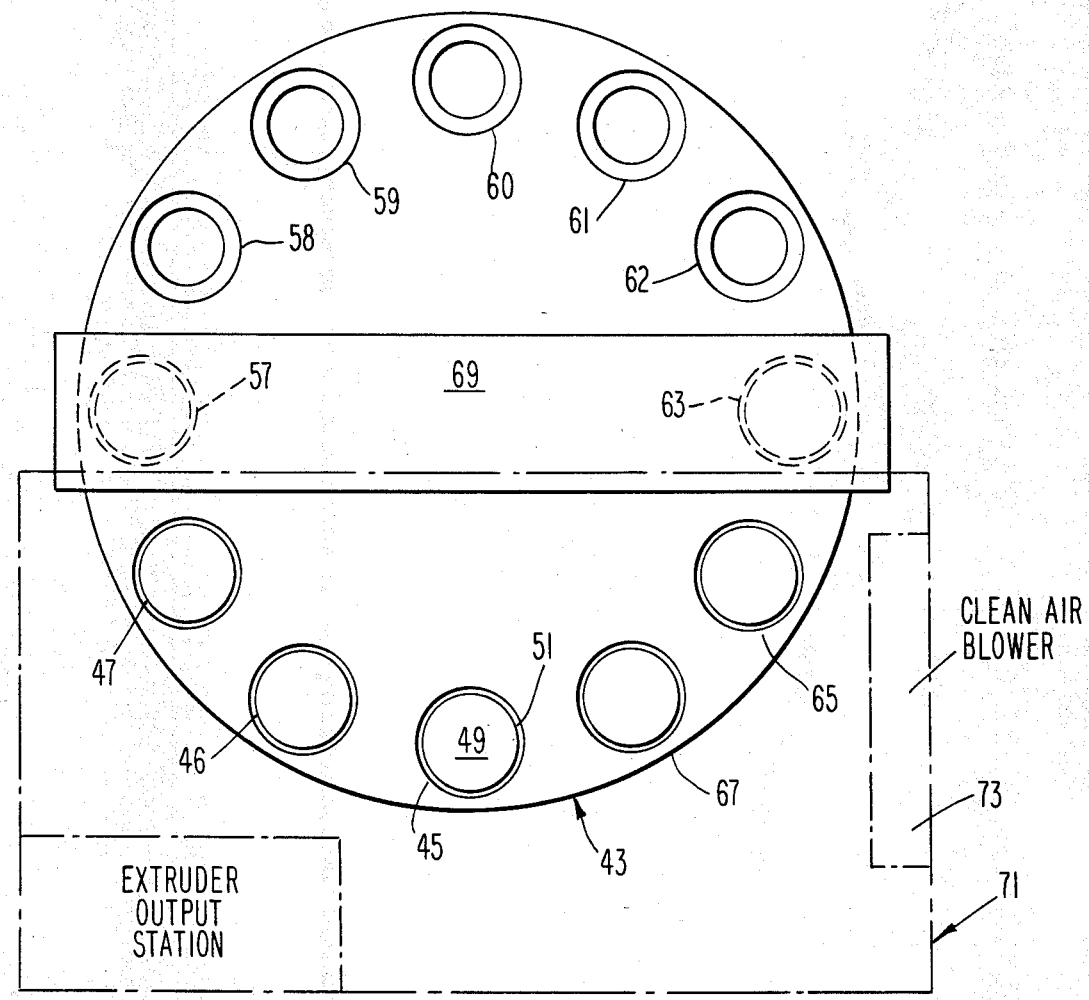
FIG. 2 depicts a top view of the system and in particular shows the loading table and its relationship to the loading position under the hollow cylinder.

Consider now FIG. 2 which depicts the rotating load and unload table 43. As can be seen in FIG. 2 the load and unload table 43 has a plurality of apertures such as apertures 45, 46 and 47 around the outer section of the table. The apertures are formed to be completely open through the table in the area 49 and yet have a ledge 51 which is formed to hold the lower ledge 53 of the carrier (see ledge 53 in FIG. 1B). In other words the carrier fits into the aperture, such as aperture 45, with ledge 53 coming in abutment with the ledge 51. In this way a piston is able to push through the open area 49 come in contact with the surface 55 (shown in FIG. 1B) in order to lift the entire carrier out of the aperture 45. The driving mechanism for the load/unload table is not shown and in the preferred embodiment it is a Geneva Indexing System but it could be other forms of motor driven devices which will step the load/unload table in a clockwise direction. In FIG. 2 it can be seen that there is a molding press output station shown in phantom. The substrates are taken from the press output station and loaded into a carrier which is sitting in the position shown by the aperture 46. Shortly after a substrate is loaded into a carrier, at position 46, that carrier is advanced to the position shown by the aperture 47. This of course provides an "empty slot" in the carrier which is in the position 46 and which is awaiting the reception of a new substrate from the press. In the following period the load/unload table is advanced one more step so that the carrier which was first loaded in position 46 is now in position 57. The last mentioned carrier will be lifted from the table at position 57 and pushed into the hollow cylinder as will be explained more completely hereinafter. The apertures remain empty on the excursion along positions 58, 59, 60, 61 and 62 so that they are ready to receive a carrier at the output position 63. The carrier loaded into position 63 is holding a substrate that has been coated. As will become more meaningful hereinafter after the substrates are coated, the carriers are pushed downward through a hollow cylinder at position 63 and are loaded one at a time into a waiting empty aperture in the load/unload table 43. An unloaded carrier is advanced to positions 65 and 67 and may be lifted from the table at position 67, or a subsequent position, by the operator of the system or automatically as the case may be. An empty carrier (i.e. without a substrate) is present at the aperture position 45 to await loading of a compact disk substrate at position 46 and the operation repeats itself.

Figure 3:
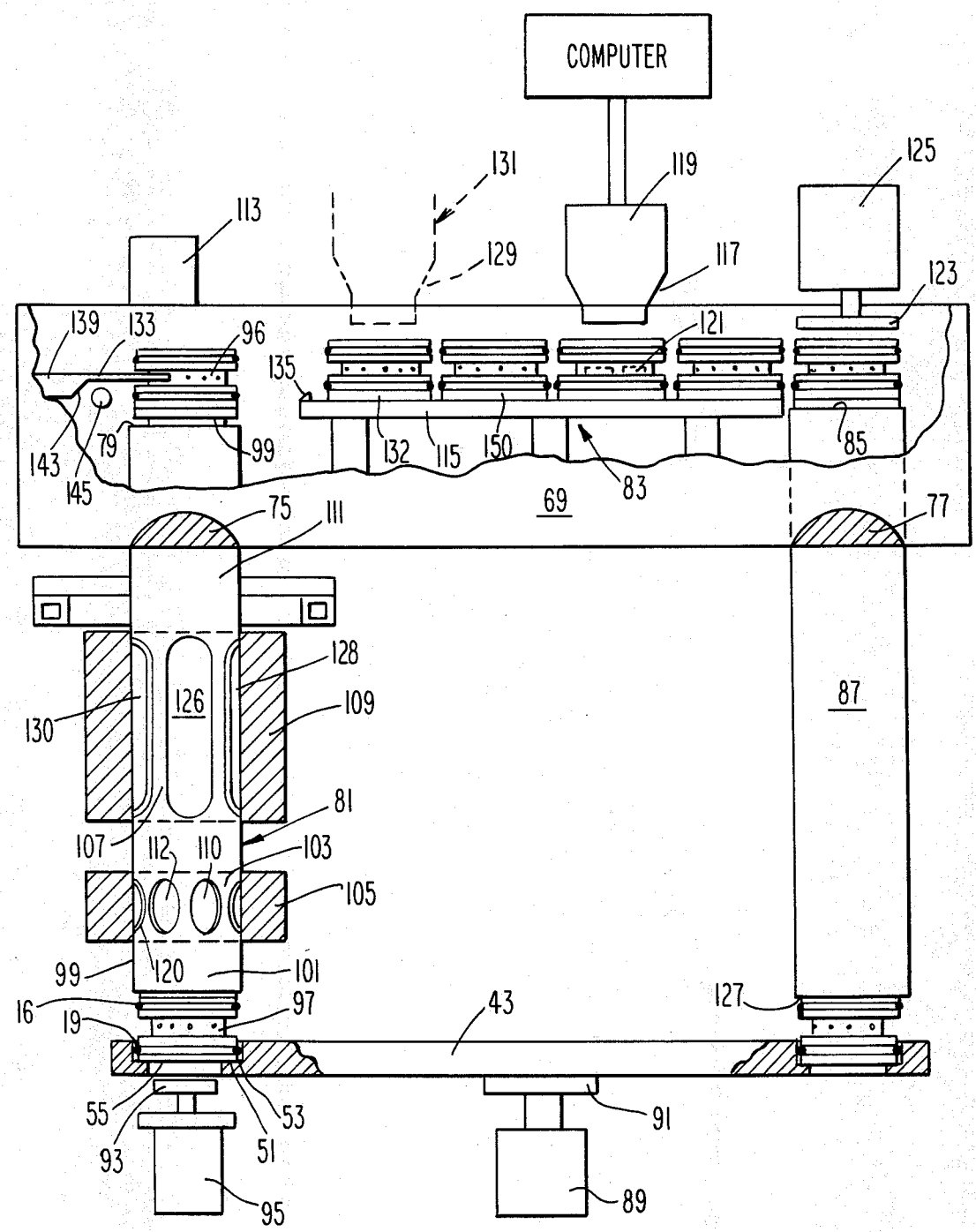
FIG. 3 is a schematic layout depicting the vertical hollow cylinder and the vacuum stations to which it passes as well as the coating chamber.

As can be recognized from FIG. 2 the coating chamber 69 straddles the load/unload table and as will become more meaningful from the discussion of FIG. 3, the carriers are pushed vertically into the coating chamber 69 and are then moved from left to right (as viewed in FIG. 2) and are pushed downward out of the coating chamber 69 at the position 63. FIG. 2 is shown in a simple form and it should be understood that there are support braces, mechanisms for pumping the loading chamber down into a suitable vacuum condition, and further devices to effect the coating experience itself such as a sputtering device or means for creating a plasma, all of which are not shown. None of these devices are shown in order that concepts of the present invention can be more clearly understood.

In FIG. 2 there is shown in phantom a hood 71 which spans the area in which the apertures 46 and 47 as well as the press output station are located. The hood 71 has a blower 73 which blows "clean air" across the area so that the substrates which come from the press output station and are placed in a carrier at position 46 do not become contaminated. The hood 71 may be a Class 100 unit utilizing Hepa filters but could be a commercial hood such as the kind that are sold by Laminaire Corporation. The hood 71, along with the "clean air" blower 73, effects a relatively small local clean room characteristic for the present device but reduces the expenses that go along with an actual large clean room setting as is required by the prior art systems.

Consider FIG. 3 which depicts a schematic side view of the present apparatus. As can be seen in FIG. 3 there is a coating chamber 69 which is supported by two support braces 75 and 77. The wall of the chamber 69 is "broken away" to show the exit position 79 of the hollow cylinder 81. The "broken away" section also shows the transport arrangement 83 and the entry position 85 of the hollow cylinder 87. As can be seen in FIG. 3, the load/unload table 43 is driven by an indexing device 89 which is fastened to the table 43 by the plate 91. Also as can be seen in FIG. 3, the lower ledge 53 (which was discussed in connection with the description of FIG. 1) is shown resting on the ledge 51 (which was discussed in connection with the discussion of FIG. 2). The lower surface 55, as seen in FIG. 3, is awaiting contact with the piston 93. The piston 93 is driven by a piston driving mechanism 95 which in the preferred embodiment is an air cylinder manufactured by Lin Act Co. but other forms of piston driving mechanisms can be used. The piston 93 is driven upward to come in contact with the surface 55 and in response thereto the carrier 97 is driven into the hollow cylinder 81. As can be seen in FIG. 1B, the O-rings 19 and 16 are shown protruding from the carrier 11 (which is carrier 97 in FIG. 3) so that as the carrier 97 is pushed into the hollow cylinder 81 the O-rings will be squeezed inward but will be providing a force outward to form a seal between the wall 99 and the O-rings 19 and 16. The carrier 97 will be advanced to the position 101 and will remain at that position in response to the friction of the 0-ring against the side walls as well as the pressure differential between atmospheric pressure being applied to the bottom of the carrier and a lesser pressure being effected in the section 103 of the hollow cylinder because of the vacuum pump down station 105. While it appears from the drawing that only one carrier would be held in sections 101 and 103, in the preferred embodiment the vertical hollow cylinder will hold a number of such carriers. When the next carrier which is similar to the carrier 97 is pushed by the piston 93 into the hollow cylinder 81 it advances the previous carrier one space forward toward the section 103. Now it should be borne in mind that the O-rings are maintaining a seal so that the vacuum condition effected in section 103 is not disturbed by any atmospheric conditions which may exist below the carriers which are entering the hollow cylinder 81. Section 103 in the preferred embodiment is of sufficient depth to accommodate three carriers. While the carriers are in the section 103, the air is pumped out so that section 103 has a vacuum of about 100 Torr. As mentioned earlier (in connection with the discussion of FIG. IB), there are channels cut through the carrier channel 15 below the compact disk substrate, and channels which enter the carrier above the compact disk substrate, so when the pumping mechanism in the vacuum pump down chamber 105 is operating, the air and the gas contaminants are withdrawn from the substrates thereby starting the preparation of those substrates for subsequent coating.

As more carriers are pushed from the load/unload table 43, into the hollow cylinder 81 a train of carriers is advanced along the hollow cylinder 81. When such carriers leave the section 103 they are partially pumped and degassed and they pass through a nonporous section of the hollow cylinder 81 into a second vacuum section 107. In the second vacuum section 107 there is a plurality of slots in the hollow cylinder 81 which enable the second vacuum pump station 109 to pump the section 107 to a lower pressure condition. In a preferred embodiment the vacuum condition in the section 107 is $5 \times 10^{-5}$ Torr which enables a greater degassing effect to take place (on the compact disk substrates present in section 107) than was accomplished in section 103. The concept of staged vacuum pump downs is well understood and that is what is accomplished in the vacuum step down between the sections 103 and 107. The apertures in sections 103 and 107 are arranged so that bridging will not take place between the second vacuum stage and the first vacuum stage. In a preferred embodiment the pump 105 is an Alcotell Direct Two Stage Pump while the pump in station 109 is a CT-7 cryopump manufactured by CTI Company. It should be understood that other equivalent high vacuum pumps can be employed.

Figure 4:
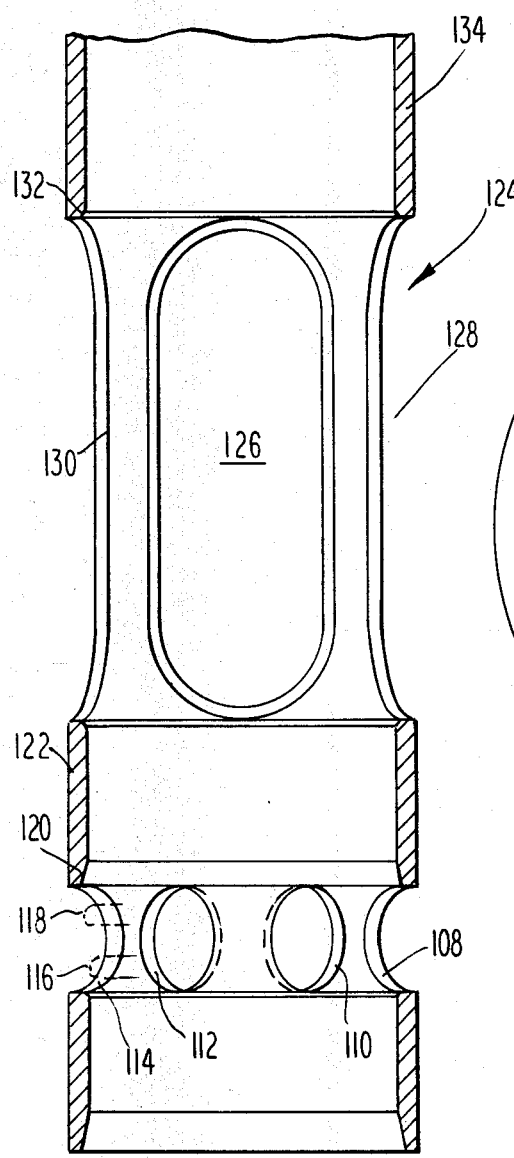
FIG. 4 is an enlarged view of a section of the hollow cylinder.

It should also be understood that as the carriers advance into vacuum stations 103 and 107 the O-rings 16 and 19 expand outward toward the apertures and slots in those stations. If the inner wall 99 is merely formed to have apertures therein whose inner edges are flush with the wall, then the O-rings will expand into such apertures and as the O-rings are advanced such O-rings may be cut by the edges of the apertures. Accordingly, the walls in vacuum station sections 103 and 107 are counter bored and the apertures in section 103 and the elongated slots in vacuum station 107 are tapered to permit portions of the 0-ring to expand but to prevent such expanded portions from coming in contact with a cutting edge of the apertures or the slots. The foregoing features are better seen in FIG. 4. In FIG. 4 there is shown a portion of the vertical hollow cylinder 81 which includes the apertures in section 103 and the slots in section 107. The hollow cylinder has been cut in half in FIG. 4 to provide a better appreciation of the counter bores. Note in FIG. 4 that the tapered edges 108, 110, 112 and 114 provide a bevelled rim of the apertures. In FIG. 4 there is shown in phantom at positions 116 and 118 that if O-rings on a carrier were passing through the section of the four apertures shown, that the O-rings would expand to the extent shown at 116 and 118. The expanded O-rings do not come in contact with the sharp edges of the apertures but note that the inside wall at position 120 is bevelled so that as the O-rings are moved upward they are gently squeezed inward to ride the wall 122. In like manner when carriers move through the section 124 portions of the O-rings expand into the slots 126, 128, and 130. The bevelled edges, or counter bores, at the slots 126, 128, and 130 keep the O-rings from being rubbed against the sharp edges of the slots. Note that the wall section 132 is bevelled so that the O-rings are gently squeezed inwardly as the carriers are moved upward and hence the edges of the O-rings can move against the wall section 134 without having the O-rings damaged.

Figure 5:
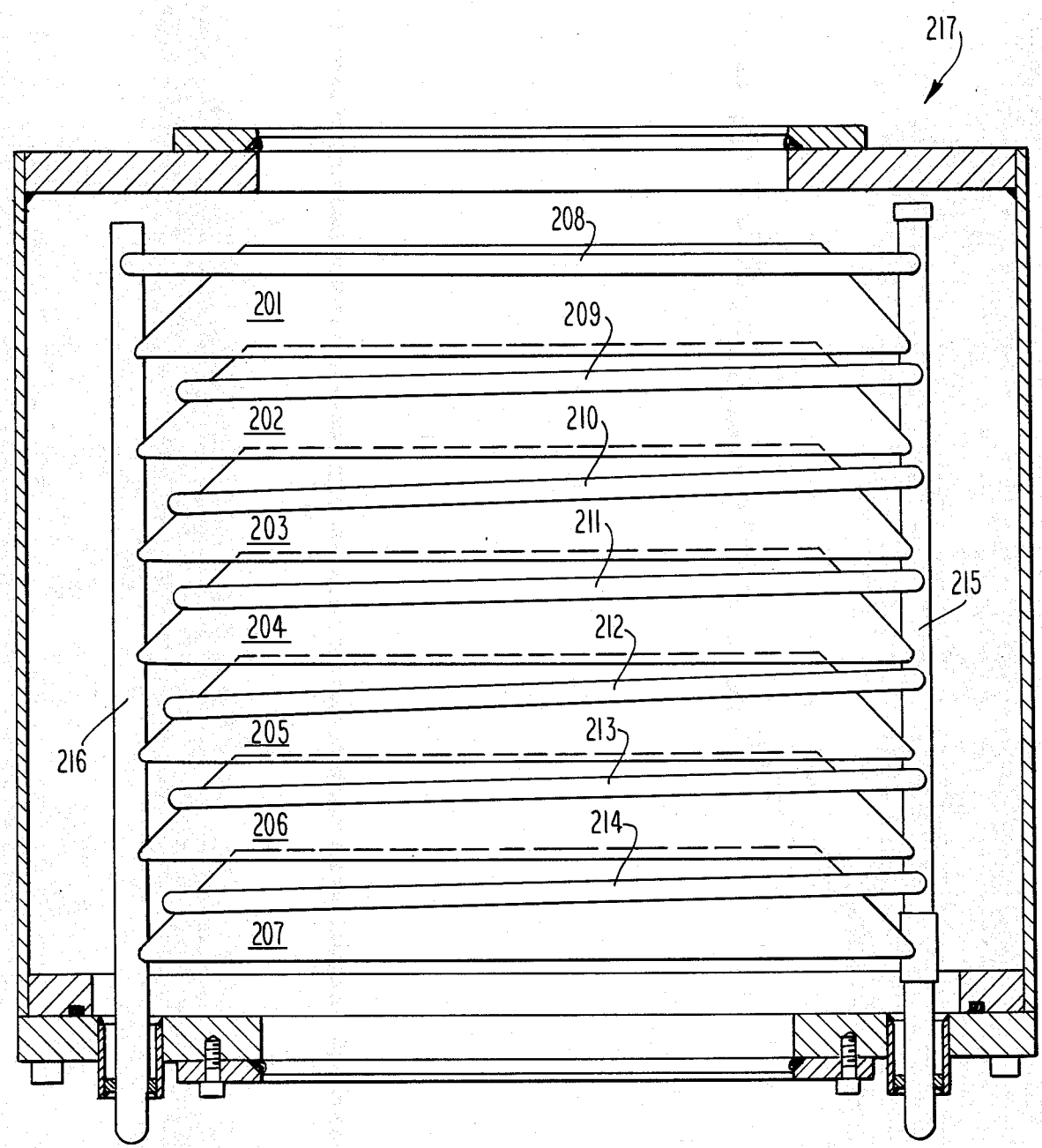
FIG. 5 is a pictorial schematic of the vapor trap.

As was mentioned earlier one of the most difficult contaminants to remove is water vapor. Included in the improvements described herein is a water vapor trap as shown in FIG. 5. In FIG. 5 there is depicted a plurality of copper plates 201-207. Each of the copper plates is secured to a different copper pipe, respectively pipes 208-214. The copper pipes 208-214 are coupled to an inlet pipe 215 on one side and to an outlet pipe 216 on the other side. In a preferred embodiment liquid nitrogen is transmitted through the pipe 215, through the pipes 208-214 and through the pipe 216. Accordingly, the plates 201-207 become extremely cold so that water condeses out of the water vapor state. The water vapor trap is located in the vacuum pressure station 109 shown in FIG. 3. The air and contaminants which are pumped from the hollow cylinder pass over the cold plates 201-207 and thus water condenses out. The plates 201-207 are set at an angle so that the water runs downward into a reservoir at the bottom of the trap and is easily removed therefrom.

If we return to the consideration of FIG. 3, we find that the carriers continue to advance out of the vacuum section 107 into the nonporous section 111 and on into the loading chamber 69 heading toward the exit position 79. In a preferred embodiment the coating chamber 69 is pumped through the pumping mechanism 113 to a vacuum condition of 1 to 4 Torr. The vacuum condition in coating chamber 69 is obtained by balancing the injection of Argon gas while pumping through a throttling aperture. Gas quantities and pumping speed are selected to minimize contamination. Accordingly, there is a higher pressure of gas in the coating chamber 69 than there is in the vacuum section 107 and the gas attempts to escape through into the vertical hollow cylinder 81. However, there is a plurality of carriers between the exit position 79 and the chamber 107 and the seals effected by the O-rings of this plurality of carriers prevents gas from escaping from the chamber 69 into the vacuum section 107. This reverse pressure of clean sputtering gas acts to flush the coating chamber 69 free of contaminants, and thus enables the compact disk substrates to be transported through the coating operation in a relatively uncontaminated form.

When a carrier, such as the carrier 96, arrives at the exit position 79, it is lifted from the following carrier such as carrier 99 onto a set of rails such as rail 115. As each carrier, such as carrier 96, is moved in a rightward direction (as viewed in FIG. 3) it pushes the train of carriers before it into a position so that a "new" carrier is under the hood 117. The hood 117 controls the coating material emanating from the chamber 119 so that the coating material is concentrated on the substrate directly under the source. In FIG. 3 there is shown a disk 121, in phantom, beneath the outer limits of the hood. Note that the carrier in FIG. 3 which is holding the disk 121 has the ledges positioned so that unwanted deposition of the material beyond the substrate is restricted.

Figure 6:
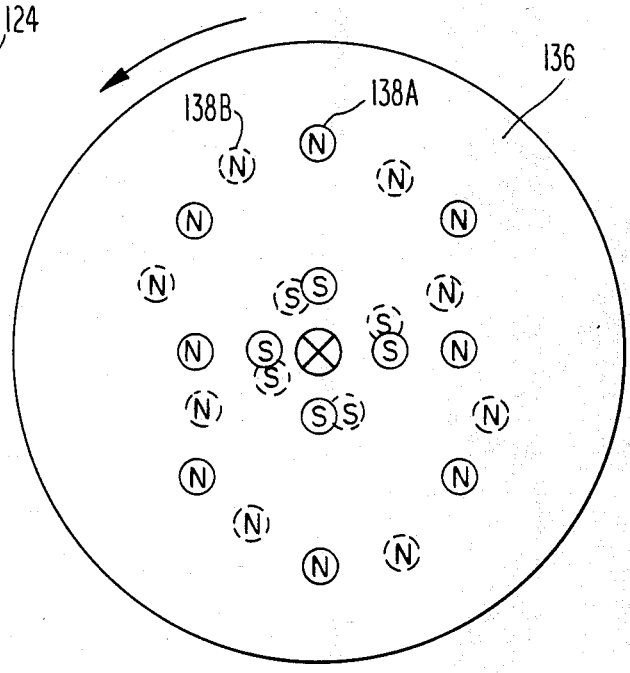
FIG. 6 is a layout of the magnets in the sputtering gun to provide a circulating magnetic field.

In the chamber 119 there is located a sputtering gun of the type manufactured by Denton Vacuum Inc. The sputtering gun includes a set of permanent magnets which provide a magnetic field whose lines of flux cross an electrostatic field to provide the BXE phnomenon found in sputtering devices. However, the permanent magnets in the preferred embodiment are mounted as shown in FIG. 6. Note in FIG. 6 the magnets which are labelled north poles are disposed in a substantially oblong array while the south pole magnets are arranged in a diamond array within the oblong pattern. The magnets are mounted on a rotatable table 136. As the rotatable table 136 is rotated, the magnets travel along the pattern shown in phantom (see the position of magnet 138A and its subsequent position 138B). In this way the glow discharge intensity is distributed and the compact disk substrates are coated uniformly. There are no shadows or lines which heretofore resulted from a smaller amount of material deposited than deposited adjacent thereto.

As can be seen in FIG. 3 the carriers advance rightward until they reach the exit position 85. A carrier is pushed off the rails (115) and comes to rest against the top of a previously unloaded carrier. After a carrier is in that position, the piston 123 is moved downward by the piston drive mechanism 125 and it pushes the carrier into vertical chamber 87. Accordingly, there is a train of carriers located in the hollow cylinder 87 and this train is pushed downward as was described in connection with the pushing up of the carriers in the vertical hollow cylinder 81. Eventually, carriers emerge from the hollow cylinder 87 at the exit position 127 and are loaded back onto the load/unload table 43.

It should be understood that a cleaning station can be located along the transport mechanism prior to compact disk substrate reaching the coating position under hood 117. In other words, the hood mechanism 129 shown in phantom along with the plasma generator 131 can be installed so that substrates located on a carrier (in the position of carrier 132) can be cleaned by ion cleaning. Such cleaning insures that those surfaces can be in the proper condition to be coated when they come under the hood 117. We have found that if the substrates are directly loaded from the press onto the load/unload table 43 as earlier described then the degassing of such substrates is sufficient to put the substrates in a condition to be coated without the necessity of ion cleaning. However, in some forms of substrates ion cleaning may be necessary and such ion cleaning can take place in the coating chamber without disrupting the continuous flow of the substrates through the system.

As can be further seen in FIG. 3 the mechanism to lift the carriers from the vertical hollow cylinder 81 is shown. It should be understood that in a preferred embodiment the device 133 is U shaped. The U shaped device 133 has a pair of arms. The U shaped device 133 is held by an arm 139 which is connected to a transfer mechanism not shown. The energization of the transfer mechanism is synchronized to the movement of the load/unload table and hence when a train of carriers has been moved by the piston, as described earlier, and the top most carrier 96 is in the position shown in FIG. 3, then the transfer mechanism is energized. When the transfer mechanism is energized, the arm 139 moves rightward, pushing the U shaped device 133 to engage the top most carrier 96. This can be understood from FIG. 3. When the cam section 143 of the arm 139 reaches the roller device 145 the cam lifts the U shaped device 133, thus lifting the carrier 96 vertically away from the carrier 99. The lifting away is important to prevent the rubbing of the materials between the carriers 96 and 99 so that these rubbed materials do not contaminate the substrates or the coating chamber 69. At the same time that the carrier 96 is lifted vertically away, it is also pushed rightward to push the clip mechanism 135 downward. Now as can be seen in FIG. 3, the previously unloaded carrier 132 has been moved the clip height rightward because the clip gets moved down as the carriers move rightward. In the operation we are discussing the carrier 96 will be moved rightward and will abut the carrier 132 (meanwhile the clip 135 will be depressed) and move the carrier 132 rightward. At the proper time the transfer mechanism will return the arm 139 to its home position, thus returning the U shaped mechanism to the position shown in FIG. 3.

It should be understood that some discrete amount of time takes place to move the carriers from position 150 to the position under the hood 117. During that discrete time which in the preferred embodiment is approximately two seconds, the coating source which is responsive to voltage, is deactivated. When the carrier is located under the hood 117 so that the substrate 121 is in position to receive the coating, then the coating source is activated and the material is coated onto the substrate 121.

The present apparatus provides a means to continuously, in a step like fashion, coat substrates in a system which is: portable; relatively inexpensive; includes the viable aspects of the clean room; and can accommodate a substrate supply means such as a molding press. It should be borne in mind that the speed of the load/unload table can be changed to accommodate different substrate input rates. It should also be understood that while the entire discussion has been in connection with a compact disk substrate other forms of substrates could be used. The present system enables the degassing of the substrates, which is so necessary, to take effect during a vertical excursion by employing the technique of employing carriers which not only carry the substrates but create a seal. With such a technique a two staged pump down can be readily accomplished. In addition the pressure gradient between the coating chamber and the last degassing chamber is reversed to flush contaminants and prevent contaminants from entering the coating chamber.

We claim:

1. An arrangement for coating substrates which are held by individual carrier means and which carrier means are continuously step moved into and out of a coating chamber, comprising in combination: a plurality of pairs of first and second O-rings respectively formed and disposed to fit a first O-ring above a second O-ring with each located around the periphery of an associated one of said carrier means; first vertical hollow cylinder means having first and second ends and having sidewall means and having apertures in at least one of said sidewall means, said first vertical hollow cylinder means designed to have a said carrier means, with said first and second O-rings, fitted therein to provide a double seal to prevent gasses from passing between said carrier means and said sidewall means, said apertures in said side walls being tapered with a sufficient taper such that said first and second O-rings do not come in contact with sharp edges when moving past said apertures; means for loading said carrier means designed and disposed to move said carrier means with said first and second O-rings into said first vertical hollow cylinder means whereby a train of said carrier means is moved through said first vertical hollow cylinder means; vacuum pump means disposed to be in close proximity to said at least one section of said first vertical hollow cylinder means to create a vacuum in said at least one section to thereby degas substrates held by a said carrier means located in said at least one section; transport means designed and disposed to move a said carrier means which has passed through said first vertical hollow cylinder means; and vacuum chamber coating means designed to house said transport means, said vacuum chamber coating means further designed to house means to materially coat said substrates, said means to materially coat said substrates disposed with respect to said transport means to materially coat said substrate which are being moved by said transport means; and means to remove said carrier means from said transport means and from said vacuum chamber coating means.

2. An arrangement for coating substrates according to claim 1 wherein said first and second O-rings are fabricated from polyurethane.

3. An arrangement for coating substrates according to claim 3 wherein there is a transition section of said vertical hollow cylinder disposed above said at least one section with apertures therein and wherein said transition section has a tapered wall so that said first and second O-rings are gently squeezed as they are pushed upward through said vertical hollow cylinder.

4. An arrangement for coating substrates according to claim 1 wherein within said vacuum pump means there is located a water vapor trap which causes water vapor which is pumped from said vertical hollow cylinder and the carriers therein to be chilled and cause the water to condense out.

5. An arrangement for coating substrates which are held by individual carrier means and which carrier means are continuously step moved into and out of a coating chamber, comprising in combination: a plurality of pairs of first and second O-rings respectively formed and disposed to fit a first O-ring above a second O-ring with each located around the periphery of an associated one of said carrier means; said first and second O-ring formed of polyurethane; first vertical hollow cylinder means having first and second ends and having sidewall means and having counter bored apertures in at least one section of said sidewall means, said first vertical hollow cylinder means designed to have a said carrier means, with said first and second O-rings, fitted therein to provide a double seal to prevent gasses from passing between said carrier means and said sidewall means; said first vertical hollow cylinder means designed to have a transition section above said at least one section with tapered walls to gently squeeze said first and second O-rings after they have passed said apertures; means for loading said carrier means designed and disposed to move said carrier means into said first vertical hollow cylinder means whereby a train of said carrier means is moved through said first vertical hollow cylinder means; vacuum pump means disposed to be in close proximity to said at least one section of said first vertical hollow cylinder means to create a vacuum in said at least one section to thereby degas substrates held by a said carrier means located in said at least one section; water vapor trap means located within said vacuum pump means to remove water vapor from contaminants pumped by said pump means; transport means designed and disposed to move said carrier means which have passed through said first vertical hollow cylinder means; and vacuum chamber coating means designed to house said transport means, said vacuum chamber coating means further designed to house means to materially coat said substrates, said means to materially coat said substrates disposed with respect to said transport means to materially coat said substrates which are being moved by said transport means; and means to remove said carrier means from said transport means and from said vacuum chamber coating means.

* * * * *